(12) United States Patent  (10) Patent No.: US 6,711,032 B2
Sommer  (45) Date of Patent: Mar. 23, 2004

(54) SHIELD AND METHOD FOR SHIELDING AN ELECTRONIC DEVICE

(75) Inventor: Henry David Sommer, Lawrenceville, GA (US)

(73) Assignee: Mitsubishi Wireless Communications, Inc., Duluth, GA (US)

( * ) Notice: Subject to any disclaimer, the term of this patent is extended or adjusted under 35 U.S.C. 154(b) by 0 days.

(21) Appl. No.: 09/989,004

(22) Filed: Nov. 20, 2001

(65) Prior Publication Data

US 2003/0095396 A1 May 22, 2003

(51) Int. Cl.[7] ................................................. H05K 9/00
(52) U.S. Cl. ...................... 361/816; 361/752; 361/797; 361/800; 174/35 R; 174/51
(58) Field of Search ............................... 361/752, 724, 361/714, 816, 797, 800, 796, 756; 174/35, 51 R; 257/99

(56) References Cited

U.S. PATENT DOCUMENTS

| 5,175,395 A | * | 12/1992 | Moore ................... 174/35 MS |
| 5,354,951 A | * | 10/1994 | Lange, Sr. et al. ......... 174/35 R |
| 5,577,268 A | * | 11/1996 | Ho et al. .................... 361/800 |
| 5,895,884 A | * | 4/1999 | Davidson .................. 174/35 R |
| 6,140,575 A | * | 10/2000 | Gunten et al. ............ 174/35 R |
| 6,194,653 B1 | * | 2/2001 | McMiller et al. ...... 174/35 GC |
| 6,377,472 B1 | * | 4/2002 | Fan ............................. 361/800 |

* cited by examiner

*Primary Examiner*—David Martin
*Assistant Examiner*—Hung Bui
(74) *Attorney, Agent, or Firm*—Oblon, Spivak, McClelland, Maier & Neustadt, P.C.

(57) ABSTRACT

A shield and a method for shielding are provided for preventing radio frequency energy from entering or exiting an electronic device. The shield includes a frame surrounding the electronic device. The frame has a first frame wall and a second frame wall arranged with a first gap in between that extends along the first frame wall. The first frame wall is arranged in a first plane, the second frame wall is arranged in a second plane, and the first plane intersects the second plane. The shield also includes a cover surrounding the frame. The cover has a first cover wall and a second cover wall arranged with a second gap in between that extends along the second cover wall. The arrangements of the first gap and the second gap prevent radio frequency energy from entering or escaping the electronic device.

20 Claims, 4 Drawing Sheets

SHIELD AND METHOD FOR SHIELDING AN ELECTRONIC DEVICE

BACKGROUND

The present invention is directed a shield and a method for shielding. More particularly, the present invention is directed to a shield and a method for shielding an electronic device to prevent radio frequency energy from entering or escaping the device.

In many electronic devices, such as those used in radio transceivers, shielding is used to prevent radio frequency energy from entering or escaping the device. For example, certain electronic components must be shielded from interference caused by radio frequency energy radiation so that the performance of the device is not degraded. Also, shielding prevents radiation from escaping the device.

Metal shields have traditionally been used for shielding electronic devices, since metal is an effective barrier to radio frequency radiation. Typically, radio frequency shields are made out of sheet metal that is bent along the sides to fold down over the device. Bending the sheet metal in this manner produces gaps at the corners where the sides are folded down. These gaps are large in comparison to the radio frequency wavelengths and allow radio frequency energy to escape and enter the device. The gaps become a particular problem at higher frequencies (smaller wavelengths).

FIG. 1A illustrates an exterior view of a conventional shield 100. The shield includes a cover 105 and a frame 115. The frame 115 is typically soldered to the board supporting the electronic device and surrounds the electronic device. The cover surrounds the frame. The cover and/or frame may include holes allowing ventilation and reducing the weight of the shield. The cover includes walls 110 and 120, and the frame includes walls 140 and 150. To make the shield easier to form, a gap 130a is typically left between the walls 110 and 120 of the cover at the corner of the shield 100. A gap 130b is also left at the corner of the shield, between the walls 140 and 150 of the frame. The gaps 130a and 130b line up in the direction of the corner of the shield, forming a gap that extends from the top to the bottom of the shield.

FIGS. 1B–1E illustrate other exterior views of a conventional shield. FIG. 1B illustrates an exterior view from a corner of the shield, showing how the gaps 130a and 130b line up to form a single gap. FIG. 1C illustrates an exterior view from one side of the shield, e.g., along the length of the shield. From this view, the gap 130a in the cover and the gap 130b in the frame are visible. FIG. 1D illustrates an exemplary view from a side of the shield that intersects the side shown in FIG. 1C, along the width of the shield. In FIG. 1C, both gaps 130a and 130b are visible. FIG. 1E illustrates an exemplary view from the top of the shield, in which the top 115 of the cover joining the walls 110 and 120 of the cover is visible. The frame is not visible in this view. In this view, the gaps in the frame and cover line up to form a gap 130 at the corner of the shield.

As can be seen from FIGS. 1A, 1B, and 1E, the gaps in the frame and the cover line up in the direction extending towards the corner of the shield, forming a single gap. This gap permits RF energy to escape and enter the electronic device encased within the shield 100.

Although only one corner of the shield is illustrated in FIGS. 1A–1E for ease of explanation, there typically is a gap at each of the corners of the shield. RF energy escapes and enters the device at each of these gaps.

Instead of bending sheet metal to form a shield, the metal can be drawn. This largely eliminates the gaps at the corners of the shield. However, this method of forming a shield is more expensive. Also, this method of forming a shield usually produces a single piece shield that is soldered to the board supporting the electronic device. The shield must be unsoldered to repair the device or the board.

There is thus a need for a shield and method for shielding an electronic device from radio frequency entering or escaping in a simple, inexpensive manner.

SUMMARY

It is an object of the present invention to provide a shield and a method for effectively shielding an electronic device from radio frequency energy entering or escaping in an inexpensive manner, with a minimal number of parts.

This and other objects are met by a shield and a method for shielding an electronic device. According to an exemplary embodiment, the shield includes a frame surrounding the electronic device. The frame has a first frame wall and a second frame wall arranged with a first gap in between that extends along the first frame wall. The first frame wall is arranged in a first plane, the second frame wall is arranged in a second plane, and the first plane intersects the second plane. The shield also includes a cover surrounding the frame. The cover has a first cover wall and a second cover wall arranged with a second gap in between that extends along the second cover wall. The arrangements of the first gap and the second gap prevent radio frequency energy from entering or escaping the electronic device.

According to one embodiment, the first cover wall is arranged in a plane substantially parallel to the first plane, and the second cover wall is arranged in a plane substantially parallel to the second plane. The first plane and the second plane may be oriented substantially perpendicular to each other.

According to exemplary embodiments, the distance that each gap extends is a small percentage of the wavelength of the radio frequency energy. According to one embodiment, the distance that each gap extends is approximately 1% of the wavelength of the radio frequency energy.

The shield may be made of metal, and the frame may be soldered to a board supporting the electronic device. The electronic device may include at least one component in a cellular telephone.

DETAILED DESCRIPTION

According to exemplary embodiments, a shield prevents radio frequency energy from escaping or entering one or more electronic devices. The shield includes a cover and a frame, each having multiple intersecting walls.

For ease of manufacturability, gaps are permitted between the intersecting walls of the cover and between the intersecting walls of the frame. To prevent radio frequency energy from escaping or entering the device, however, the gaps are arranged such that the gaps between the intersecting walls of the frame do not line up with the gaps between the intersecting walls of the cover. According to one embodiment, this is implemented by omitting the gaps on some of the walls, and extending the gaps on the walls that intersect those walls.

Figure 1A:
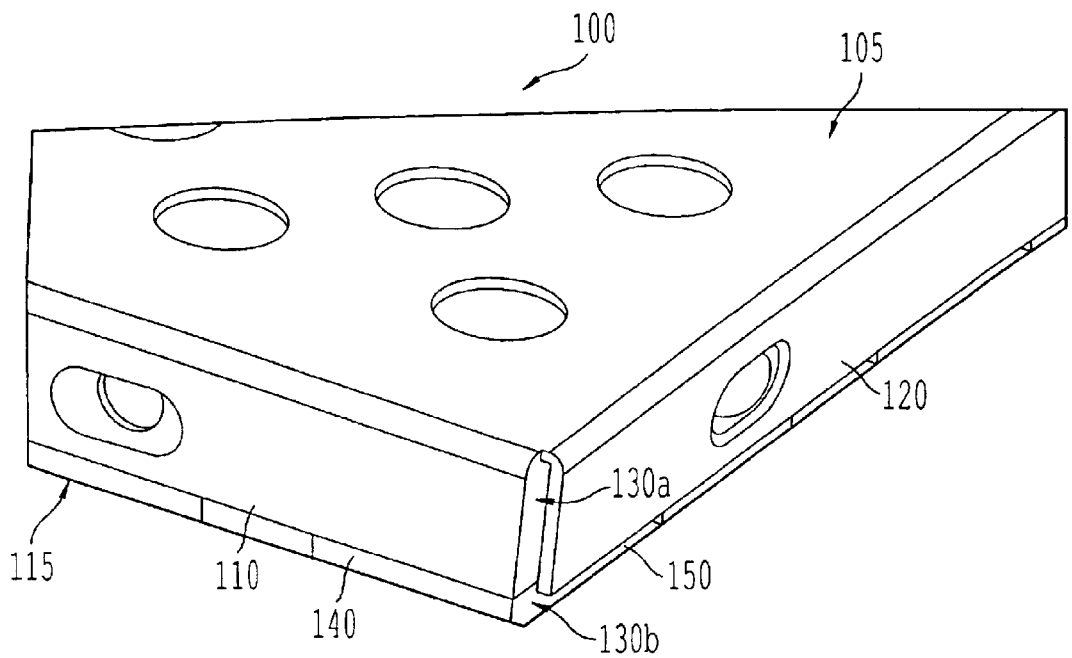
FIGS. 1A–1E illustrate exterior views of a conventional shield.
Figure 1B:
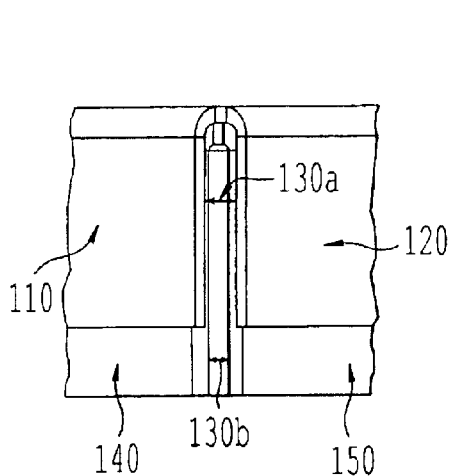
Figure 1C:
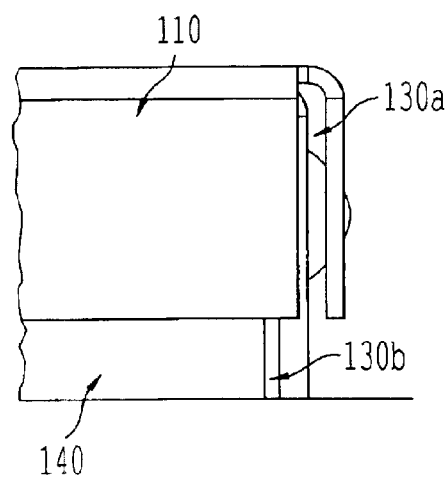
Figure 1D:
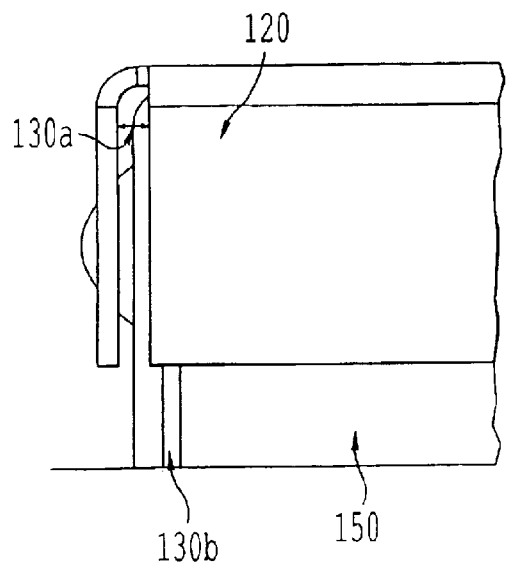
Figure 1E:
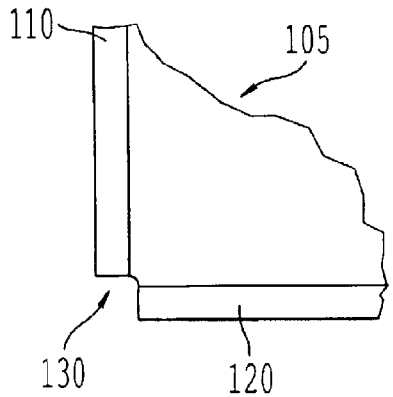
Figure 2A:
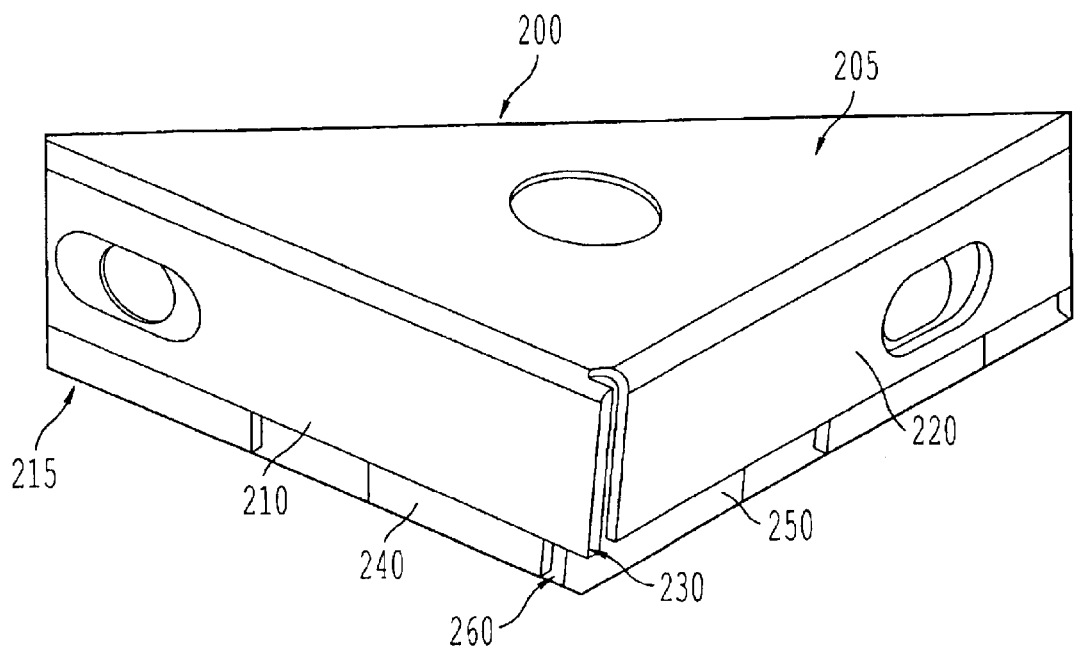
FIGS. 2A–2E illustrate exemplary exterior views of a shield according to the present invention.

FIG. 2A illustrates an exemplary exterior corner view of a shield 200 covering an electronic device. The exemplary shield shown in FIG. 2A includes a cover 205 having a cover wall 210 intersecting a cover wall 220. The shield also includes a frame 215 including a frame wall 240 intersecting a frame wall 250. The frame 215 may be soldered to the board supporting the device, e.g., a printed circuit board. The cover 205 may be attached, e.g., snapped onto the frame 215. Attaching the cover to the frame in this manner permits easy access to the device, e.g., for repairing the device. The cover only needs to be unattached, e.g., unsnapped from the frame, and the entire shield does not need to be removed.

The cover and/or frame may include holes allowing ventilation and reducing the weight of the shield. A gap 230 is disposed between the cover walls 210 and 220. Another gap 260 is disposed between the frame walls 240 and 250. The gaps 230 and 260 are arranged between the walls so that the gap 230 does not line up with the gap 260. This prevents RF energy from entering or escaping the electronic device (or devices) encased within the shield.

Figure 2B:
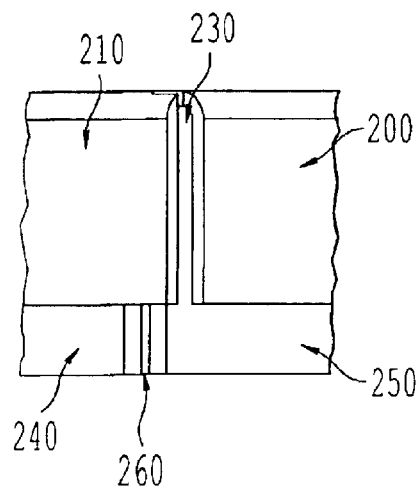
Figure 2C:
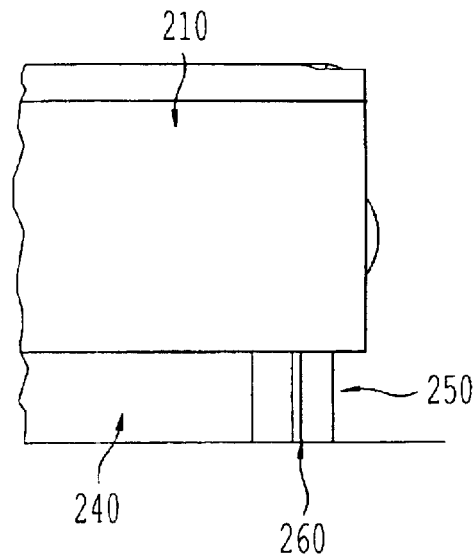
Figure 2D:
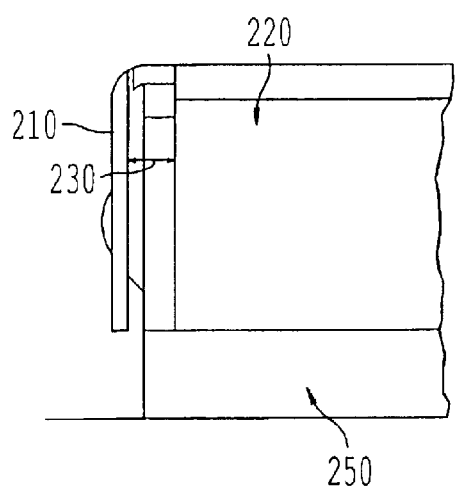
Figure 2E:
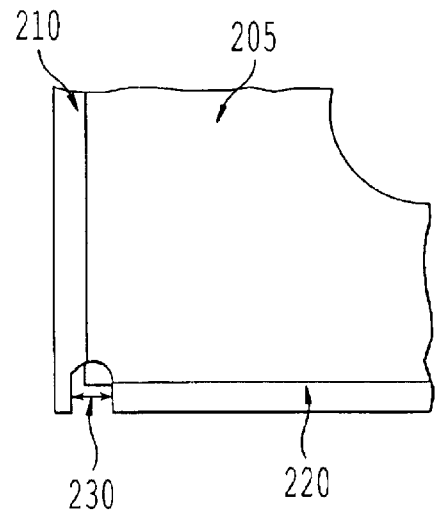

FIG. 2B illustrates an exemplary exterior view of the corner of the shield 200. This view illustrates how the gaps 230 and 260 do not line up. FIG. 2C illustrates an exemplary view of one side of the shield 200, e.g., along the length of the shield. From this view, only the gap 260 in the frame is visible. FIG. 2D illustrates a view from an intersecting side of the shield 200, e.g., along the width of the shield. From this view, only the gap 230 in the cover is visible. FIG. 2E illustrates an exemplary top view of the shield 200, in which only the gap in the cover 230 is visible.

As can be seen in FIGS. 2A, 2B, and 2E, the gap 260 between the walls 240 and 250 of the frame and the gap 230 between the walls 210 and 220 of the cover do not line up. This prevents RF energy from escaping and entering the electronic device encased within the shield 200.

It will be appreciated that although only one corner of the shield 200 is shown in FIG. 2A for ease of explanation, the gaps between the other intersecting walls of the frame and the cover may be arranged in a similar fashion as that depicted in FIGS. 2A–2E. Also, the gaps do not have to be arranged exactly as depicted in FIGS. 2A–2E. Rather, the gaps may be situated in any manner such that the gap between the cover walls does not line up with the gap between the frame walls.

Although in the embodiment shown in FIGS. 2A–2C, the walls 210 and 220 of the cover are parallel to the corresponding walls 240 and 250 of the frame, the invention is not limited to this configuration. The cover may be installed in several orientations with respect to the frame, as long as the gaps between the intersecting walls of the cover and the gaps between the intersecting walls of the frame do not line up with each other.

In addition, although the width and the length of the shield are referenced above, it will be appreciated that the shield is not limited to a design having a length and a width, e.g., a rectangular design. Rather the shield, may be formed in any shape desired.

Further, although only one shield is described above, there may be more than one shield in any telephone, each encasing any number of electronic devices. Also, although the description above is directed to a frame soldered to a board, the frame does not have to be soldered to the board but may be affixed to the board in any manner desired. Similarly, the cover need not be snapped to the frame but may be affixed to the frame in any manner desired.

According to an exemplary embodiment, the shield may be formed from sheet metal by cutting and bending. It will be appreciated that the shield may also be formed using other methods that produce gaps in the manner described above. Any electrically conductive sheet metal, e.g., steel, may be used for the shield.

To minimize RF leakage, the width of each gap, i.e., the distance the gap extends along a wall, should be made as small as possible. An important consideration in determining the width of the gap is the ratio of the width of the gap to the wavelength of the RF energy being shielded. The smaller the width, the more shielding. According to an exemplary embodiment, the distance that the gap extends may be a small percentage, e.g., 1% of the wavelength of the radio frequency energy to be shielded. In addition, the width of any holes in the shield used, e.g., for ventilation, is made small in comparision to the wavelength.

Figure 3:
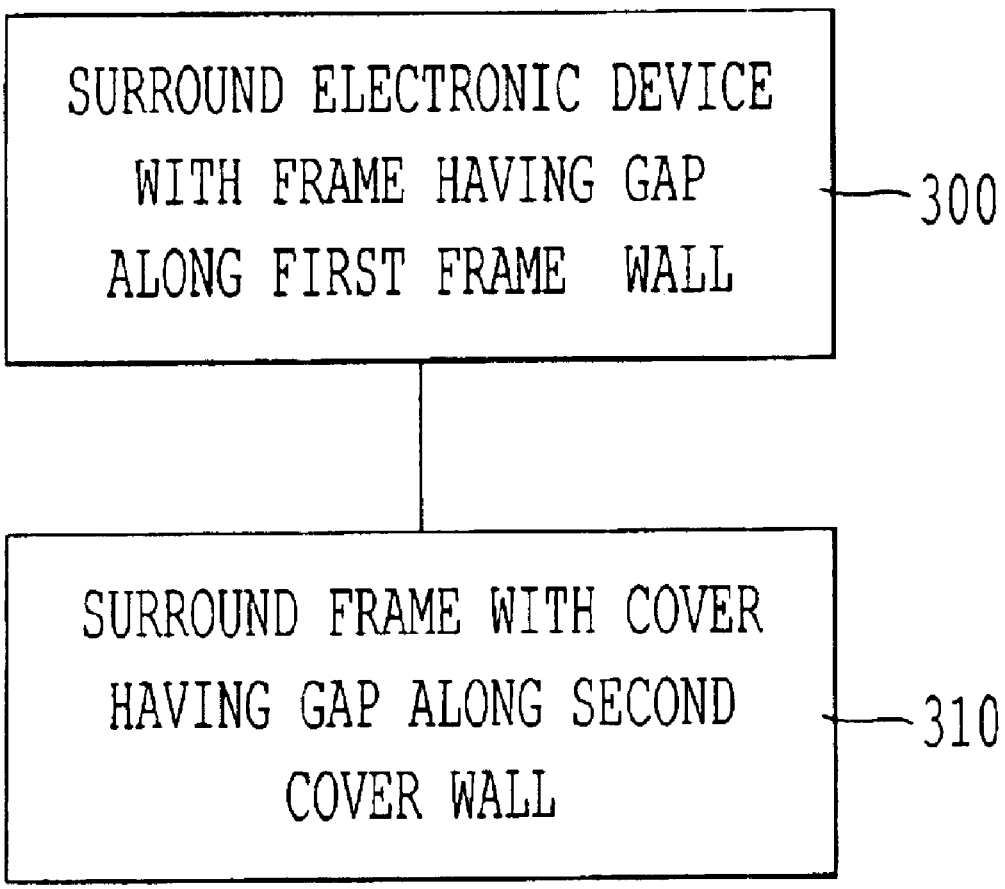
FIG. 3 illustrates an exemplary method for forming a shield according to the present invention.

FIG. 3 illustrates an exemplary method for forming a shield around one or more electronic devices. The method begins at step 300 at which the electronic device is surrounded with a frame having a first frame wall and a second frame wall arranged with a first gap in between. According to one embodiment, the gap extends along the first frame wall, e.g., the wall along the length of the shield. At step 310, the frame is surrounded with a cover having a first cover wall and a second cover wall arranged with a second gap in between. According to one embodiment, the second gap extends along the second cover wall, e.g., along the width of the shield. The arrangements of the first gap and the second gap prevent radio frequency energy from entering or escaping the electronic device.

According to exemplary embodiments, a shield and a method for shielding are provided that prevent radio frequency from entering or escaping an electronic device with little or no impact on the cost or manufacturability of the device or system that the device is included in.

It should be understood that the foregoing description and accompanying drawings are by example only. A variety of modifications are envisioned that do not depart from the scope and spirit of the invention. The above description is intended by way of example only and is not intended to limit the present invention in any way.

What is claimed is:

1. A shield for an electronic device, comprising:
   a frame surrounding the electronic device and having a first frame wall and a second frame wall arranged with a first gap in between thereby separating the first frame wall from the second frame wall, the first gap extending along the first frame wall, wherein the first frame wall is arranged in a first plane, the second frame wall is arranged in a second plane, and the first plane intersects the second plane; and
   a cover surrounding the frame and having a first cover wall and a second cover wall arranged with a second gap in between that extends along the second cover wall, wherein the arrangements of the first gap and the second gap prevent radio frequency energy from entering or escaping the electronic device.

2. The shield of claim 1, wherein the first cover wall is arranged in a plane substantially parallel to the first plane, and the second cover wall is arranged in a plane substantially parallel to the second plane.

3. The shield of claim 1, wherein the first plane and the second plane are substantially perpendicular to each other.

4. The shield of claim 1, wherein the shield is made of metal.

5. The shield of claim 1, wherein the frame is soldered to a board supporting the electronic device.

6. The shield of claim 1, wherein the distance that each gap extends is a small percentage of the wavelength of the radio frequency energy.

7. The shield of claim 6, wherein the distance that each gap extends is approximately 1% of the wavelength of the radio frequency energy.

8. The shield of claim 1, wherein the electronic device includes at least one component in a cellular telephone.

9. The shield of claim 1, wherein the first gap is offset with respect to the second gap when the cover surrounds the frame whereby the first gap does not overlap with the second gap.

10. The shield of claim 1, wherein a peripheral portion of an inner surface prescribing said second gap in said first cover wall of said cover is opposite to one of side surfaces of said second cover wall prescribing said second gap.

11. A method for shielding an electronic device, comprising the steps of:

surrounding the electronic device with a frame having a first frame wall and a second frame wall arranged with a first gap in between thereby separating the first frame wall from the second frame wall, the first gap extending along the first frame wall, wherein the first frame wall is arranged in a first plane, the second frame wall is arranged in a second plane, and the first plane intersects the second plane; and surrounding the frame with a cover having a first cover wall and a second cover wall arranged with a second gap in between that extends along the second cover wall, wherein the arrangements of the first gap and the second gap prevent radio frequency energy from entering or escaping the electronic device.

12. The method of claim 11, wherein the first cover wall is arranged in a plane substantially parallel to the first plane, and the second cover wall is arranged in a plane substantially parallel to the second plane.

13. The method of claim 11, wherein the first plane and the second plane are substantially perpendicular to each other.

14. The method of claim 11, wherein the shield is made of metal.

15. The method of claim 11, wherein the step of surrounding the electronic device includes soldering the frame to a board supporting the electronic device.

16. The method of claim 11, wherein the distance that each gap extends is a small percentage of the wavelength of the radio frequency energy.

17. The method of claim 16, wherein the distance that each gap extends is approximately 1% of the wavelength of the radio frequency energy.

18. The method of claim 11, wherein the electronic device includes at least one component in a cellular telephone.

19. The method of claim 11, wherein the first gap is offset with respect to the second gap when the cover surrounds the frame whereby the first gap does not overlap with the second gap.

20. A shield for an electronic device, comprising:

a frame surrounding the electronic device and having a first frame wall and a second frame wall arranged with a first gap in between; and a cover surrounding the frame and having a first cover wall and a second cover wall arranged with a second gap in between, wherein the first cover wall is arranged in a first plane, the second cover wall is arranged in a second plane, and the first plane intersects the second plane, and wherein the first gap is offset with respect to the second gap when the cover surrounds the frame whereby the first gap does not overlap with the second gap.

* * * * *